(12) United States Patent
Lensing

(10) Patent No.: US 6,464,563 B1
(45) Date of Patent: Oct. 15, 2002

(54) METHOD AND APPARATUS FOR DETECTING DISHING IN A POLISHED LAYER

(75) Inventor: Kevin R. Lensing, Austin, TX (US)

(73) Assignee: Advanced MicroDevices, Inc., Austin, TX (US)

( * ) Notice: Subject to any disclaimer, the term of this patent is extended or adjusted under 35 U.S.C. 154(b) by 0 days.

(21) Appl. No.: 09/860,226

(22) Filed: May 18, 2001

(51) Int. Cl.[7] .............................................. B24B 49/00

(52) U.S. Cl. .................... 451/6; 451/5; 451/8; 451/41; 451/287; 451/288

(58) Field of Search ............................. 451/5, 6, 8, 41, 451/287, 288; 216/84, 85, 89, 91

(56) References Cited

U.S. PATENT DOCUMENTS 5,835,221 A * 11/1998 Lee et al. .................... 356/369
6,277,657 B1 * 8/2001 Nozawa et al. ................ 438/8
6,316,276 B1 * 11/2001 Gregory et al. ................ 438/8

* cited by examiner

Primary Examiner—Timothy V. Eley
Assistant Examiner—Shantese McDonald
(74) Attorney, Agent, or Firm—Williams, Morgan & Amerson, P.C.

(57) ABSTRACT

A method for polishing wafers includes providing a wafer having a grating structure including a trench and a process layer formed in the trench; illuminating at least a portion of the process layer and the grating structure with a light source; measuring light reflected from the illuminated portion of the process layer and the grating structure to generate a reflection profile; and identifying dishing in the process layer based on the reflection profile. A metrology tool adapted to receive a wafer having a grating structure including a trench and a process layer formed in the trench, includes a light source, a detector, and a data processing unit. The light source is adapted to illuminate at least a portion of the process layer overlying the grating structure. The detector is adapted to measure light reflected from the illuminated portion of the grating structure and the process layer to generate a reflection profile. The data processing unit is adapted to identify dishing in the process layer based on the reflection profile.

32 Claims, 6 Drawing Sheets

METHOD AND APPARATUS FOR DETECTING DISHING IN A POLISHED LAYER

BACKGROUND OF THE INVENTION

1. Field of the Invention

This invention relates generally to the field of semiconductor device manufacturing and, more particularly, to a method and apparatus for detecting dishing in a polished layer.

2. Description of the Related Art

Chemical mechanical polishing (CMP) is a widely used means of planarizing silicon dioxide as well as other types of layers on semiconductor wafers. Chemical mechanical polishing typically utilizes an abrasive slurry disbursed in an alkaline or acidic solution to planarize the surface of the wafer through a combination of mechanical and chemical action. Generally, a chemical mechanical polishing tool includes a polishing device positioned above a rotatable circular platen or table on which a polishing pad is mounted. The polishing device may include one or more rotating carrier heads to which wafers may be secured, typically through the use of vacuum pressure. In use, the platen may be rotated and an abrasive slurry may be disbursed onto the polishing pad. Once the slurry has been applied to the polishing pad, a downward force may be applied to each rotating carrier head to press the attached wafer against the polishing pad. As the wafer is pressed against the polishing pad, the surface of the wafer is mechanically and chemically polished.

As semiconductor devices are scaled down, the importance of chemical mechanical polishing to the fabrication process increases. In particular, it becomes increasingly important to control and minimize within-wafer topography variations. For example, in one embodiment, to minimize spatial variations in downstream photolithography and etch processes, it is necessary for the oxide thickness of a wafer to be as uniform as possible (i.e., it is desirable for the surface of the wafer to be as planar as possible).

Those skilled in the art will appreciate that a variety of factors may contribute to producing variations across the post-polish surface of a wafer. For example, variations in the surface of the wafer may be attributed to drift of the chemical mechanical polishing device. Typically, a chemical mechanical polishing device is optimized for a particular process, but because of chemical and mechanical changes to the polishing pad during polishing, degradation of process consumables, and other processing factors, the chemical mechanical polishing process may drift from its optimized state.

FIG. 1A illustrates a cross-section of an exemplary semiconductor device 100 that is subjected to a planarization process. The semiconductor device 100 includes a substrate 110 with a plurality of trenches 120 defined therein. The trenches 120 may be used to form shallow trench isolation (STI) structures between active regions of subsequently formed devices (e.g., transistors). A silicon nitride stop layer 130 is formed over the substrate 110 and patterned to define openings used to etch the trenches 120. A silicon dioxide layer 140 is formed over the silicon nitride stop layer 130 and fills the trenches 120.

As seen in FIG. 1B, the silicon dioxide layer 140 is polished to remove the portions not disposed within the trenches 120. Typically, the polishing process continues until the silicon nitride stop layer 130 is reached. Various endpoint techniques may be used for determining the end point for the polishing process. The polishing rate of the silicon nitride stop layer 130 is less than the polishing rate of the silicon dioxide layer 140, resulting in observable changes to the polishing process parameters when the silicon nitride stop layer 130 is reached. For example, electrical parameters (e.g., motor current) of the polishing tool may be monitored to determine when the silicon nitride stop layer 130 is reached. Endpoint detection techniques are approximate, and some polishing may continue after the silicon nitride stop layer 130.

The chemical slurry used in the polishing process has a higher etch rate for oxide than for nitride. Hence, when the silicon nitride stop layer 130 is reached, the silicon dioxide layer 140 will be removed at a faster relative rate. A flexible polishing pad used in the polishing process may conform to the surface of the silicon nitride stop layer 130 and the silicon dioxide layer 140 and continue to etch the silicon dioxide layer 140 at a faster rate, resulting in a phenomenon commonly referred to as "dishing." The susceptibility of the silicon dioxide layer 140 to dishing is dependent somewhat on the width and spacing (i.e., pitch) of the trenches 120. Wider features allow the polishing pad to conform to the surface easier and exacerbate a dishing problem.

Dishing may also occur during the polishing of other process layers on the semiconductor device 100. For example, interconnections are commonly formed by, depositing a conductive material (e.g., tungsten or copper) in trenches defined in an insulting layer (i.e., silicon dioxide). The conductive material is polished to remove portions not disposed in the trenches, similar to the STI process described above.

Dishing can cause various problems in the fabrication of the semiconductor device 100. For example, dishing reduces the amount of the process layer (e.g., silicon dioxide or conductive material) disposed in the trenches. If the amount of material removed is significant, the electrical properties of the features may be altered. For example, an STI structure may have reduced insulating capacity and a conductive feature may have increased resistivity. These defects can result in a reduction in the performance of the completed device (e.g., speed rating, power consumption, leakage current, etc.).

The present invention is directed to overcoming, or at least reducing the effects of, one or more of the problems set forth above.

SUMMARY OF THE INVENTION

One aspect of the present invention is seen in a method for polishing wafers. The method includes providing a wafer having a grating structure including a trench and a process layer formed in the trench; illuminating at least a portion of the process layer and the grating structure with a light source; measuring light reflected from the illuminated portion of the process layer and the grating structure to generate a reflection profile; and identifying dishing in the process layer based on the reflection profile.

Another aspect of the present invention is seen in a metrology tool adapted to receive a wafer having a grating structure including a trench and a process layer formed in the trench. The metrology tool includes a light source, a detector, and a data processing unit. The light source is adapted to illuminate at least a portion of the process layer overlying the grating structure. The detector is adapted to measure light reflected from the illuminated portion of the grating structure and the process layer to generate a reflection profile. The data processing unit is adapted to identify dishing in the process layer based on the reflection profile.

BRIEF DESCRIPTION OF THE DRAWINGS

The invention may be understood by reference to the following description taken in conjunction with the accompanying drawings, in which like reference numerals identify like elements, and in which.

Figure 1A:
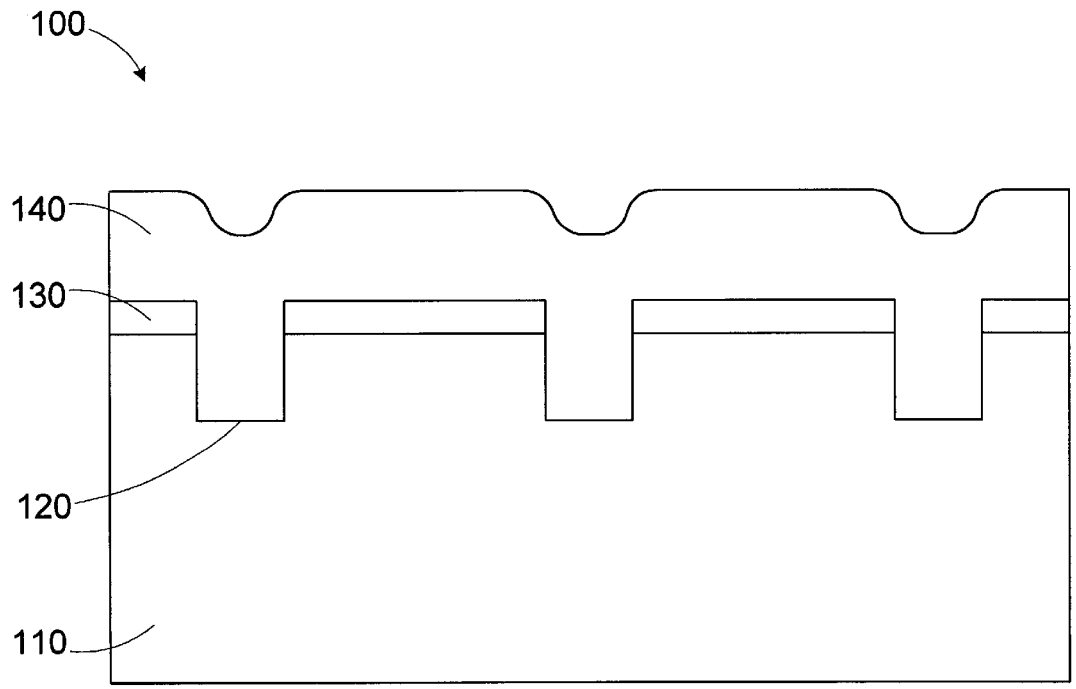
FIGS. 1A and 1B are cross sections of an exemplary semiconductor device on which a polishing process is performed.
Figure 1B:
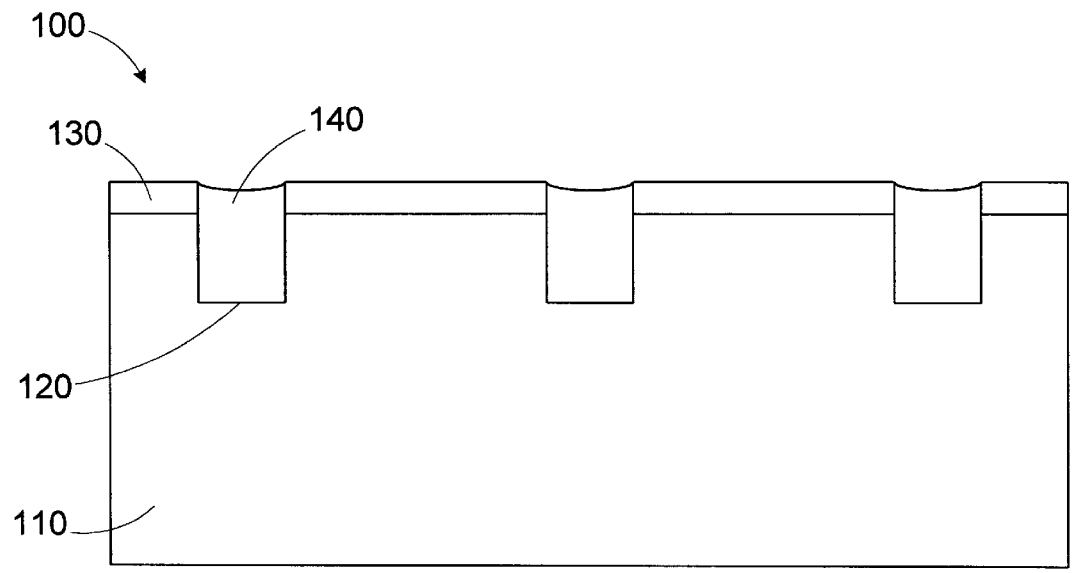

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
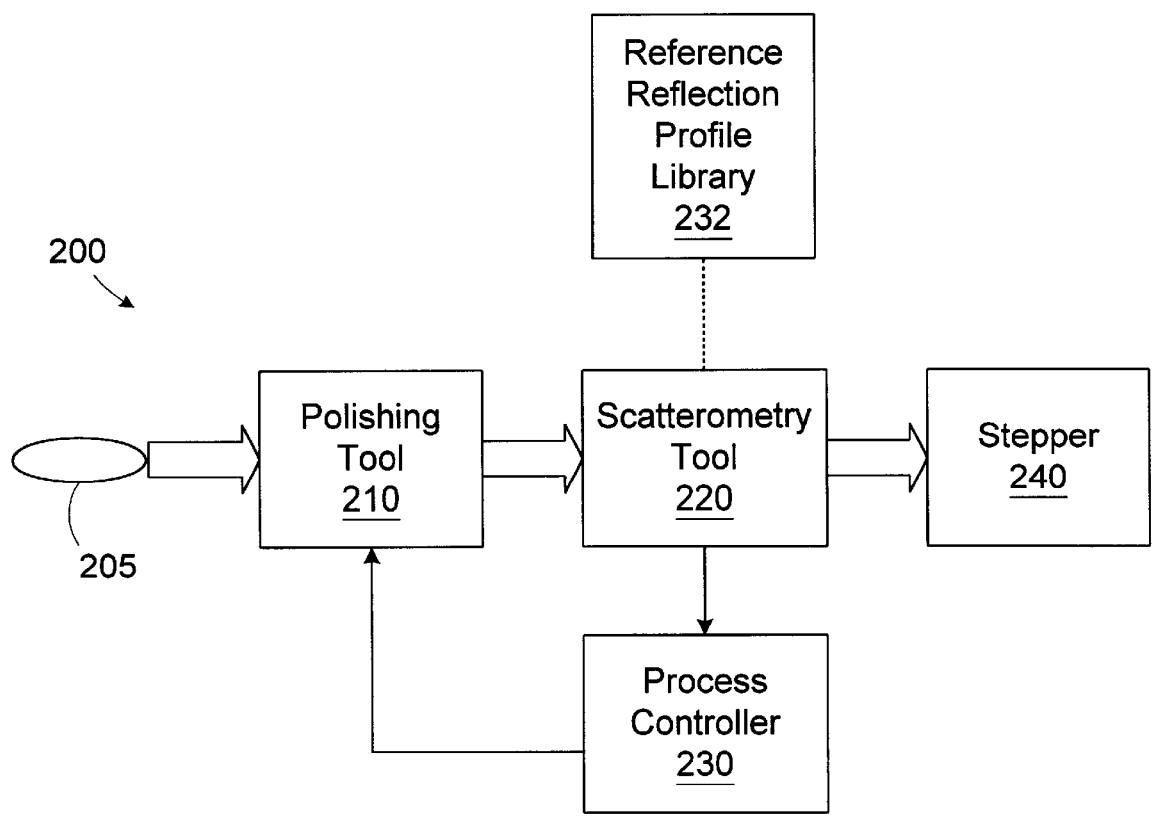
FIG. 2 is a simplified diagram of an illustrative processing line for processing wafers in accordance with one illustrative embodiment of the present invention.

Referring to FIG. 2, a simplified diagram of an illustrative processing line 200 for processing wafers 205 in accordance with one illustrative embodiment of the present invention is provided. The processing line 200 includes a polishing tool 210 for polishing the wafers 205 in accordance with a polishing recipe. The polishing tool 210 may be used to polish process layers formed on the wafer 205, such as the silicon dioxide and silicon nitride layers described above, metal layers, or other process layers. Variations in the polishing operations of the polishing tool 210 and the geometry of the features formed on the wafer 205 may cause dishing of process layers as previously described.

The processing line 200 includes a scatterometry tool 220 adapted to measure dishing of polished process layers on the wafer 205. In general, the scatterometry tool 220 includes optical hardware, such as an ellipsometer or reflectometer, and a data processing unit loaded with a scatterometry software application for processing data collected by the optical hardware. For example, the optical hardware may include a model OP5230 or OP5240 with a spectroscopic ellipsometer offered by Thermawave, Inc. of Freemont CA. The data processing unit may comprise a profile application server manufactured by Timbre Technologies, a fully owned subsidiary of Tokyo Electron America, Inc. of Austin, TX and distributed by Thermawave, Inc. The scatterometry tool 220 may be external to the polishing tool 210 or, alternatively, the scatterometry tool 220 may be installed in an in-situ arrangement.

A process controller 230 is provided for providing feedback to the polishing tool 210 based on the dishing measured by the scatterometry tool 220. The process controller 230 adjusts its operating recipe to improve the uniformity of the polishing process and reduce dishing for subsequently polished wafers 205.

In the illustrated embodiment, the process controller 230 is a computer programmed with software to implement the functions described. However, as will be appreciated by those of ordinary skill in the art, a hardware controller designed to implement the particular functions may also be used. Moreover, the functions performed by the process controller 230, as described herein, may be performed by multiple controller devices distributed throughout a system. Additionally, the process controller 230 may be a stand-alone controller, it may be integrated into a tool, such as the polishing tool 210 or the scatterometry tool 220, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 230, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

In one embodiment, the scatterometry tool 220 measures dishing on features formed in the production devices. In some cases, the geometry of the features or the presence of underlying structures may inhibit scatterometry measurements. Accordingly, test structures having the same general configuration as features formed on the wafer 205 may be employed. The test structures may be formed in a region of the wafer 205 not normally used for forming devices (e.g., in the periphery region where identification codes are typically scribed or in the scribe lines between production die).

Figure 3A:
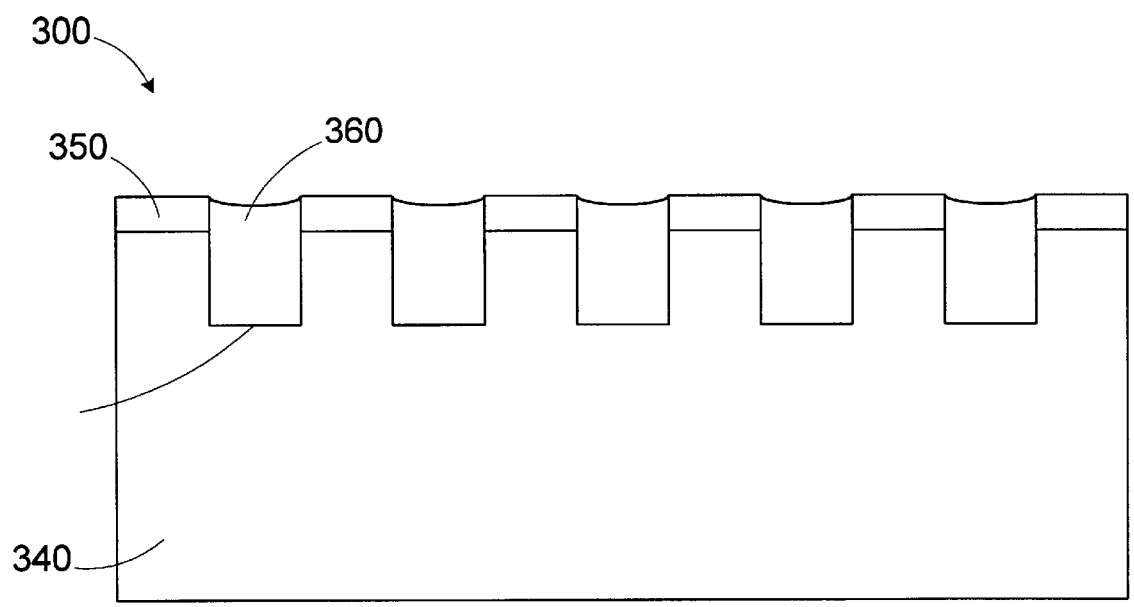
FIGS. 3A and 3B are cross sections of an exemplary semiconductor device including test grating structures.
Figure 3B:
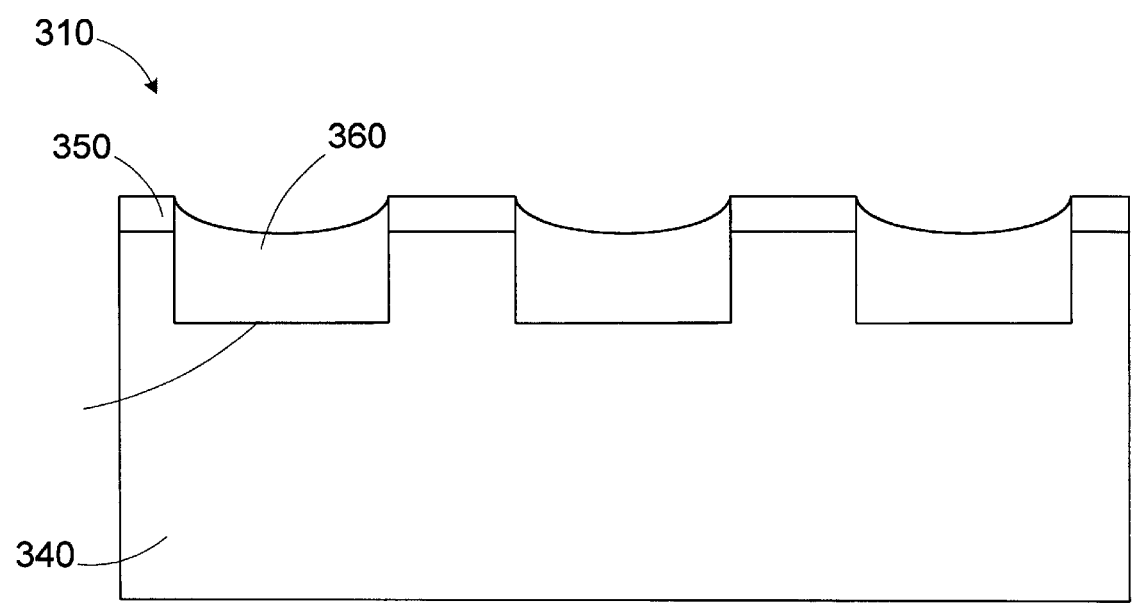

Referring briefly to FIGS. 3A and 3B, exemplary grating structures 300, 310 that may used to for test structures on the wafer 205 are shown. The grating structures 300, 310 have the same general construction (e.g., geometry, materials, etc.) as features included in the devices formed on the wafer 205. In the illustrated embodiment, the grating structures 300, 310 include trenches 320, 330 formed in a substrate 340. A polish stop layer 350 (e.g., silicon nitride) is formed over the substrate 340, and a process layer 360 (e.g., silicon dioxide) is deposited in the trenches 320, 330 and polished until the polish stop layer 350 is reached. The trenches 320 have a different width and pitch than the trenches 330 and thus have a different susceptibility to dishing. For example, because the trenches 330 are wider relative to the trenches 320, the process layer 360 will have increased dishing in the trenches 330. Depending upon the device geometry and application, the trench widths may range from 200–800 nanometers, and the pitch may vary similarly from 500–1200 nanometers.

Figure 4:
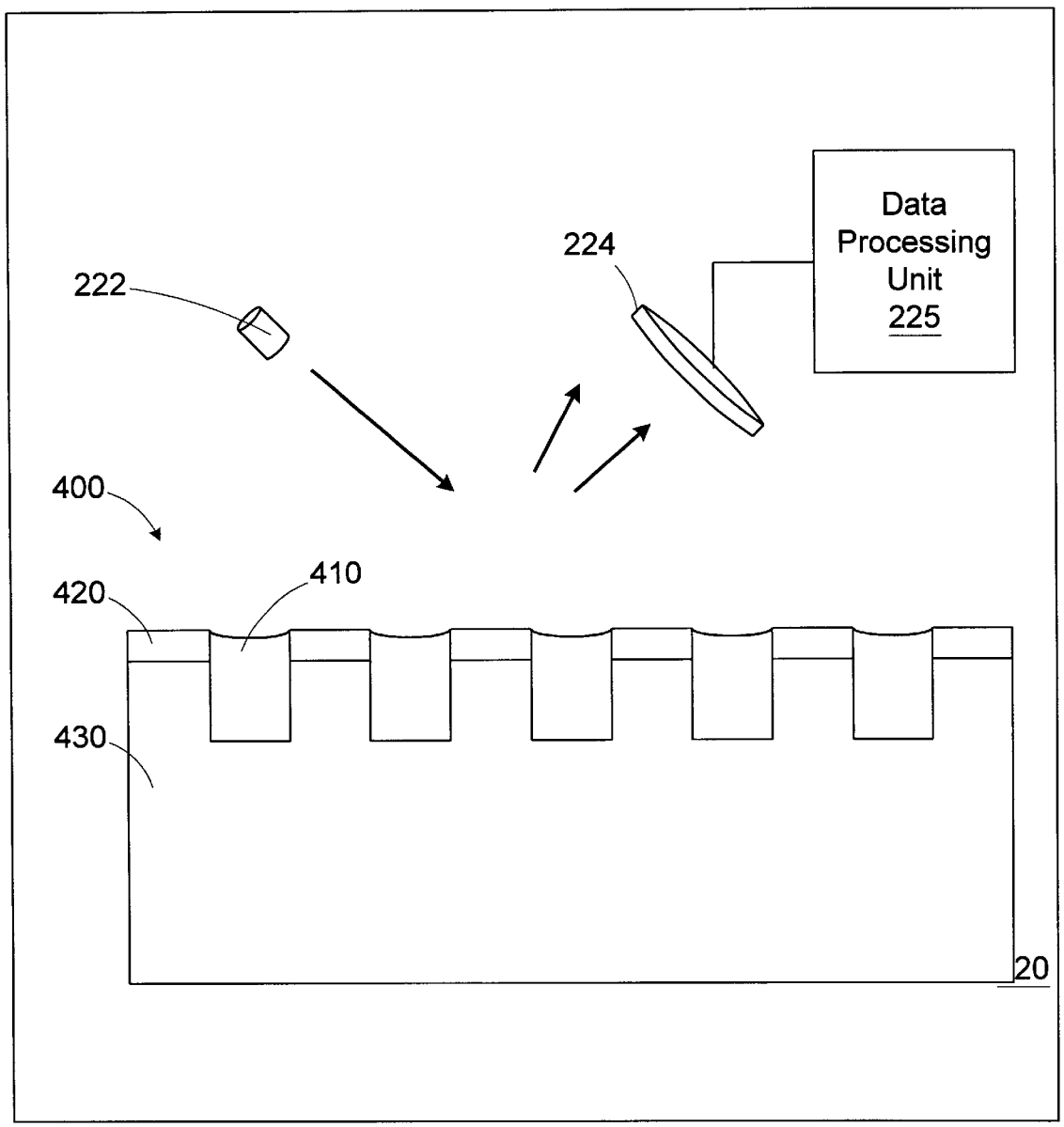
FIG. 4 is a simplified view of the scatterometry tool of FIG. 2 loaded with a wafer including the test structures of FIGS. 3A and 3B.

Turning now to FIG. 4, a simplified view of the scatterometry tool 220 loaded with a wafer 205 having a grating structure 400 filled with a process layer 410 is provided. A stop layer 420 may also be present to protect an underlying base layer 430 (e.g., substrate for STI polish). The grating structure 400 may be a feature formed in a production device on the wafer 205, or alternatively, the grating structure 400 may be a test structure similar to the grating structures 300, 310 discussed above in reference to FIGS. 3A and 3B. The scatterometry tool 220, includes a light source 222 and a detector 224 positioned proximate the grating structure 400 and process layer 410. The light source 222 of the scatterometry tool 220 illuminates at least a portion of the grating structure 400 and process layer 410, and the detector 224 takes optical measurements, such as intensity or phase, of the reflected light. A data processing unit 225 receives the optical measurements from the detector 224 and processes the data to identify dishing in the process layer 410.

The scatterometry tool 220 may use monochromatic light, white light, or some other wavelength or combinations of wavelengths, depending on the specific implementation. The angle of incidence of the light may also vary, depending on the specific implementation. The light analyzed by the scatterometry tool 220 typically includes a reflected component (i.e., incident angle equals reflected angle) and a refracted component (i.e., incident angle does not equal the reflected angle). For purposes of discussion here, the term "reflected" light is meant to encompass both components.

Variations in the amount of dishing seen in the process layer 410 causes changes in the reflection profile (e.g., intensity vs. wavelength—$\tan(\delta)$, phase vs. wavelength—$\sin(\psi)$, where $\delta$ and $\psi$ are common scatterometry outputs known to those of ordinary skill in the art) measured by the scatterometry tool 220 as compared to the light scattering profile that would be present in a process layer 410 having little or no dishing, or at least acceptable amounts of dishing.

Figure 5A:
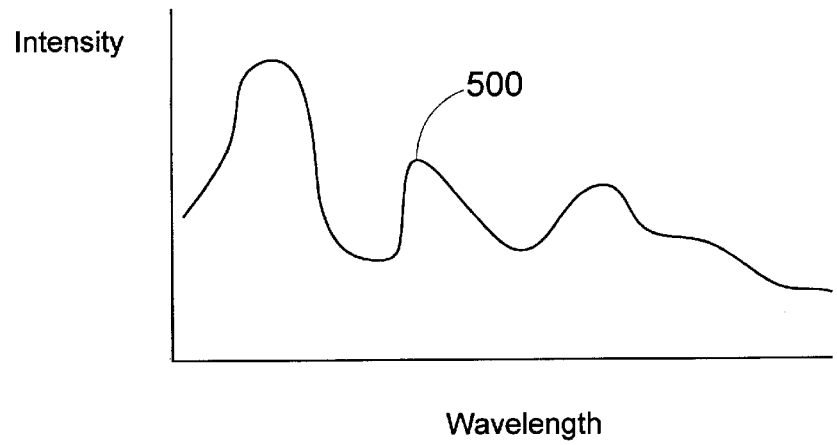
FIGS. 5A, 5B, and 5C illustrate a library of exemplary scatterometry curves used to characterize the wafer measured in the scatterometry tool of FIG. 4.
Figure 5B:
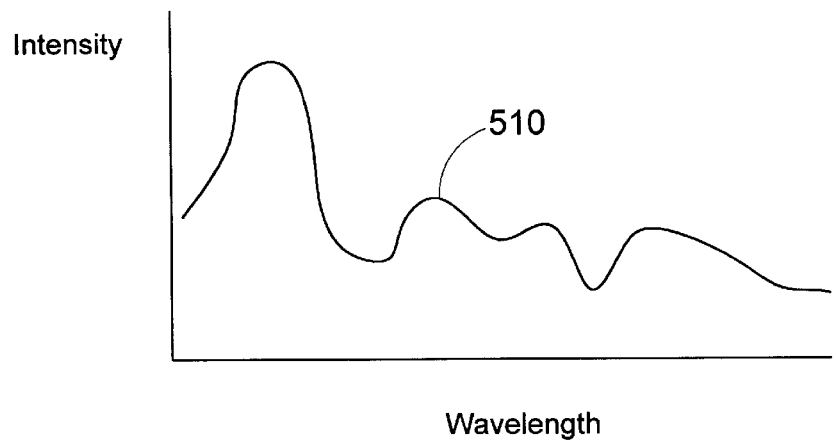
Figure 5C:
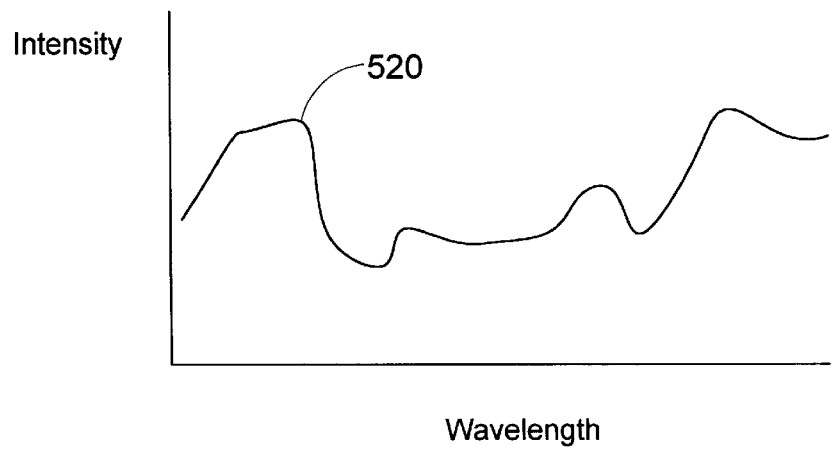

FIGS. 5A, 5B, and 5C illustrate exemplary reflection profiles 500, 510, 520 that may be included in a reference reflection profile library 232 (see FIG. 2) used by the data processing unit 225 to characterize the dishing of the process layer 410 based on the reflection profiles measured by the scatterometry tool 220. The particular reflection profile expected for any structure depends on the specific geometry of the grating structure 400 and the parameters of the measurement technique employed by the scatterometry tool 220 (e.g., light bandwidth, angle of incidence, etc.). The profiles in the reference reflection profile library 232 are typically calculated theoretically by employing Maxwell's equations to model individual spectra based on the expected characteristics of the process layer 410 and the topology and geometry of the grating structure 400. Spectra are generated at a predetermined resolution for every profile that may be expected, and the sum of all said spectra constitute the reference reflection profile library 232. Scatterometry libraries are commercially available from Timbre Technologies, Inc. The profiles in the reference reflection profile library 232 may also be generated empirically by measuring reflection profiles of sample wafers and subsequently characterizing the measured wafers by destructive or non-destructive examination techniques.

The reflection profile 500 of FIG. 5A represents an expected profile for process layer 410 with essentially no dishing. The reflection profile 510 of FIG. 5B represents an expected profile for a process layer 410 that has a moderate amount of dishing. The reflection profile 520 of FIG. 5C represents an expected profile for a process layer 410 that has a relatively high level of dishing. The reflection profiles of process layers 410 with varying amounts of dishing may be included in the reference reflection profile library 232.

The data processing unit 225 receives a reflection profile measured by the detector 224 and compares it to the reference reflection profile library 232. Each reference profile has an associated dishing metric related to the degree of dishing. For example, the dishing metric may comprise the radius of curvature of the oxide/air interface. The data processing unit 225 determines the reference reflection profile having the closest match to the measured reflection profile. Techniques for matching the measured reflection profile to the closest reference reflection profile are well known to those of ordinary skill in the art, so they are not described in greater detail herein.

In another embodiment, the process controller 230 or other external controller (not shown) may be adapted to compare the measured reflection profile to the reference reflection profile library 232. In such a case, the scatterometry tool 220 would output the matching reference reflection profile, and the process controller 230 may link that reference reflection profile to an associated dishing metric.

In another embodiment, the measured reflection profile may be compared to a target reflection profile selected from the reference reflection profile library 232 for a process layer 410 having a known and desired dishing characteristic (e.g., no dishing or minimal dishing). For example, a target reflection profile may be calculated for a process layer 410 having an ideal or acceptable dishing profile using Maxwell's equations, and that target reflection profile may be stored in the reference reflection profile library 232. Thereafter, the measured reflection profile of a process layer 410 having an unknown degree of dishing is compared to the target reflection profile. Based upon this comparison, a relatively rough approximation of the dishing may be determined. That is, by comparing the measured reflection profile to the target reflection profile, dishing of the process layer 410 may be approximated, such that further matching of the measured reflection profile with additional reference reflection profiles from the reference reflection profile library 232 is unwarranted. Using this a technique, an initial determination may be made as to the dishing of the process layer 410. Of course, this step may be performed in addition to the matching or correlating of a measured reflection profile to a reference reflection profile from the reference reflection profile library 232 as described above.

After receiving the dishing metric from the scatterometry tool 220, the process controller 230 may take a variety of autonomous actions. In one embodiment of the present invention, the process controller 230 is adapted to modify the operating recipe of the polishing tool 210 based on the dishing metric to control polishing operations on subsequent wafers processed by the polishing tool 210. For example, the chemical slurry composition may be adjusted to reduce the selectivity of the slurry to the material of the process layer 410. Reducing the selectivity may increase the overall polish time due to the reduced polish rate, but the amount of dishing may be reduced. Alternatively, the process controller 230 may change the operating recipe of the polishing tool 210 to affect the endpoint signal in such a way as to reduce the amount of overpolish (i.e., polishing conducted after the stop layer 420 is reached). For example, the threshold value for detecting the endpoint may be changed. Other recipe parameters, such as the polish time, downforce, radial air pressure zones, etc., may also be changed.

The process controller may use a control model of the polishing tool 210 for changing its operating recipe. For example, the process controller 230 may use a control model relating the dishing metric to a particular operating recipe parameter in the polishing tool 210 to control the polishing rate or polishing time to correct for any overpolishing. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Dishing models may be generated by the process controller 230, or alternatively, they may be generated by a different processing resource (not shown) and stored on the process controller 230 after being developed. The dishing models may be developed using the polishing tool 210 or using a different tool (not shown) having similar operating characteristics. For purposes of illustration, it is assumed that the dishing models are generated and updated by the process controller 230 or other processing resource based on the actual performance of the polishing tool 210 as measured by the scatterometry tool 220. The dishing models may be trained based on historical data collected from numerous processing runs of the polishing tool 210.

The process controller 230 may also use the dishing metric for fault detection. If the amount of dishing measured is sufficient to significantly degrade the performance of the devices, the wafer may be scrapped or reworked prior to performing any additional process steps. The dishing results may also be used by process and design engineers to change the design of the device. For example, if a particular structure is susceptible to dishing that is difficult to correct by changing the operating recipe of the polishing tool 210, the structure may be redesigned (e.g., by changing the pitch, width, or layout) to reduce the susceptibility of the structure. A test structure with a wide array of space/pitch grating structures may be employed and measured to develop dishing-driven design rules.

Figure 6:
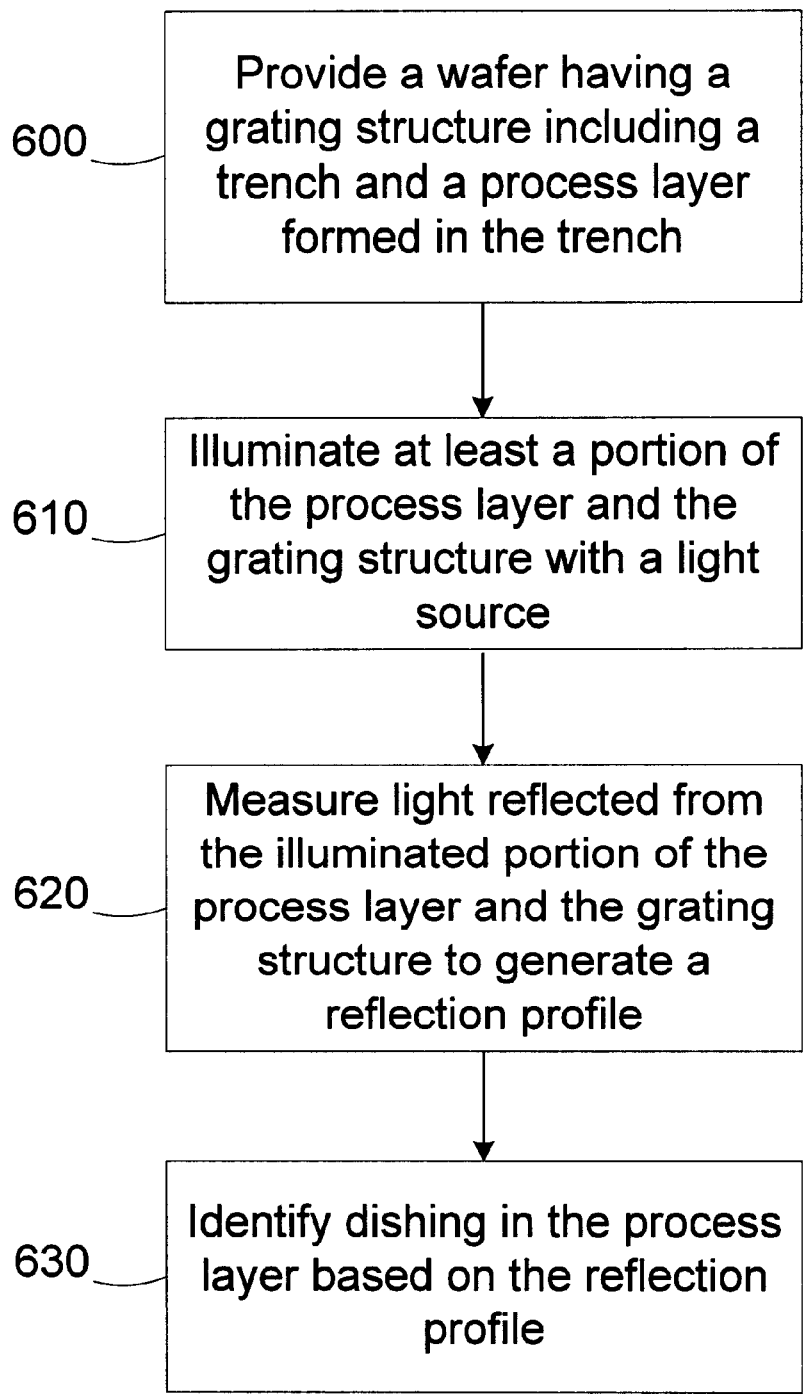
FIG. 6 is a simplified flow diagram of a method for detecting dishing in a polished layer in accordance with another illustrative embodiment of the present invention.

FIG. 6 is a simplified flow diagram of a method for controlling a polishing process in accordance with an illustrative embodiment of the present invention. In block 600, a wafer having a grating structure including a trench and a process layer formed in the trench is provided. In block 610, at least a portion of the process layer overlying the grating structure is illuminated with a light source. In block 620, light reflected from the illuminated portion of the grating structure and the process layer is measured to generate a reflection profile. In block 630, dishing in the process layer is identified based on the reflection profile.

Monitoring dishing caused by the polishing tool 210 based on feedback from the scatterometry tool 220, as described above, has numerous advantages. The polishing tool 210 may be controlled to reduce the amount of dishing encountered. Decreased dishing reduces the likelihood that a device may be degraded or must be scrapped. Accordingly, the quality of the devices produced on the processing line 200 and the efficiency of the processing line 200 are both increased. Furthermore, dishing analysis provided design engineers with feedback for redesigning features that are less susceptible to dishing.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for polishing wafers, comprising:

providing a wafer having a grating structure including a trench and a process layer formed in the trench;

illuminating at least a portion of the process layer and the grating structure with a light source;

measuring light reflected from the illuminated portion of the process layer and the grating structure to generate a reflection profile; and identifying dishing in the process layer based on the reflection profile.

2. The method of claim 1, wherein identifying dishing in the process layer further comprises:

comparing the generated reflection profile to a library of reference reflection profiles, each reference reflection profile having an associated dishing metric;

selecting a reference reflection profile closest to the generated reflection profile; and identifying dishing in the process layer based on the dishing metric associated with the selected reference reflection profile.

3. The method of claim 1, further comprising:
determining at least one parameter of an operating recipe of a polishing tool based on the reflection profile.

4. The method of claim 3, wherein determining at least one parameter of the operating recipe of the polishing tool comprises changing a chemical composition of a polishing slurry used by the polishing tool to reduce a selectivity of the polishing slurry to the process layer to reduce dishing of the process layer.

5. The method of claim 3, wherein determining at least one parameter of the operating recipe of the polishing tool comprises changing at least one of a polish time, a downforce parameter, and a radial air pressure parameter.

6. The method of claim 1, wherein generating the reflection profile comprises generating the reflection profile based on at least one of intensity and phase of the reflected light.

7. The method of claim 1, wherein providing the wafer comprises providing the water having the grating structure formed in a test structure on the wafer.

8. The method of claim 1, wherein providing the wafer comprises providing the wafer having the grating structure formed in a production device on the wafer.

9. The method of claim 1, wherein identifying dishing in the process layer further comprises:
comparing the generated reflection profile to a target reflection profile; and
identifying dishing in the process layer based on the comparison of the generated reflection profile and the target reflection profile.

10. A method for identifying dishing, comprising:
providing a wafer having a grating structure including a trench and a process layer formed in the trench;
illuminating at least a portion of the process layer overlying the grating structure with a light source;
measuring light reflected from the illuminated portion of the grating structure and the process layer to generate a reflection profile;
comparing the generated reflection profile to a library of reference reflection profiles, each reference reflection profile having an associated dishing metric;
selecting a reference reflection profile closest to the generated reflection profile; and
identifying dishing in the process layer based on the dishing metric associated with the selected reference reflection profile.

11. A method for identifying dishing, comprising:
providing a wafer having a grating structure including a trench and a process layer formed in the trench;
illuminating at least a portion of the process layer overlying the grating structure with a light source;
measuring light reflected from the illuminated portion of the grating structure and the process layer to generate a reflection profile;
comparing the generated reflection profile to a target reflection profile; and
identifying dishing in the process layer based on the comparison of the generated reflection profile and the target reflection profile.

12. A metrology tool configured to receive a wafer having a grating structure including a trench and a process, layer formed in the trench, comprising:
a light source configured to illuminate at least a portion of the process layer overlying the grating structure;
a detector configured to measure light reflected from the illuminated portion of the grating structure and the process layer to generate a reflection profile; and
a data processing unit configured to identify dishing in the process layer based on the reflection profile.

13. The metrology tool of claim 12, wherein the data processing unit is further configured to compare the generated reflection profile to a library of reference reflection profiles, each reference reflection profile having an associated dishing metric, select a reference reflection profile closest to the generated reflection profile, and identify dishing in the process layer based on the dishing metric associated with the selected reference reflection profile.

14. The metrology tool of claim 12, wherein the detector is further configured to generate the reflection profile based on at least one of intensity and phase of the reflected light.

15. The metrology tool of claim 12, wherein the metrology tool comprises at least one of a scatterometer, an ellipsometer, and a reflectometer.

16. The metrology tool of claim 12, wherein the grating structure comprises a test structure.

17. The metrology tool of claim 12, wherein the grating structure comprises a portion of a production device formed on the wafer.

18. The metrology tool of claim 12, wherein the data processing unit is further configured to compare the generated reflection profile to a target reflection profile and identify dishing in the process layer based on the comparison of the generated reflection profile and the target reflection profile.

19. The processing line of claim 12, wherein the data processing unit is further configured to compare the generated reflection profile to a library of reference reflection profiles, each reference reflection profile having an associated dishing metric, select a reference reflection profile closest to the generated reflection profile, and identify dishing in the process layer based on the dishing metric associated with the selected reference reflection profile.

20. A processing line, comprising:
a polishing tool configured to polish a wafer having a grating structure including a trench and a process layer formed in the trench in accordance with an operating recipe;
metrology tool configured to receive the wafer, the metrology tool comprising:
a light source configured to illuminate at least a portion of the process layer overlying the grating structure;
a detector configured to measure light reflected from the illuminated portion of the grating structure and the process layer to generate a reflection profile; and
a data processing unit configured to identify dishing in the process layer based on the reflection profile; and
a process controller configured to determine at least one parameter of the operating recipe of the polishing tool based on the identified dishing.

21. The processing line of claim 19, wherein the detector is furthers configured to generate the reflection profile based on at least one of intensity and phase of the reflected light.

22. The processing line of claim 19, wherein the metrology tool comprises at least one of a scatterometer, an ellipsometer, and a reflectometer.

23. The system of claim 19, wherein the grating structure comprises a test structure.

24. The system of claim 19, wherein the grating structure comprises a portion of a production device formed on the wafer.

25. The processing line of claim 19, wherein the data processing unit is further configured to compare the generated reflection profile to a target reflection profile and identify dishing in the process layer based on the comparison of the generated reflection profile and the target reflection profile.

26. The processing line of claim 19, wherein the process controller is further configured to change a chemical composition of a polishing slurry used by the polishing tool to reduce a selectivity of the polishing slurry to the process layer to reduce dishing of the process layer.

27. The processing line of claim 19, wherein the process controller is further configured to change at least one of a polish time, a downforce parameter, and a radial air pressure parameter in the operating recipe to reduce dishing of the process layer.

28. A metrology tool configured to receive a wafer having a grating structure including a trench and a process layer formed in the trench, comprising:

a light source configured to illuminate at least a portion of the process layer overlying the grating structure;

a detector configured to measure light reflected from the illuminated portion of the grating structure and the process layer to generate a reflection profile; and a data processing unit configured to compare the generated reflection profile to a library of reference reflection profiles, each reference reflection profile having an associated dishing metric, select a reference reflection profile closest to the generated reflection profile, and identify dishing in the process layer based on the dishing metric associated with the selected reference reflection profile.

29. A metrology tool configured to receive a wafer having a grating structure including a trench and a process layer formed in the trench, comprising:

a light source configured to illuminate at least a portion of the process layer overlying the grating structure;

a detector configured to measure light reflected from the illuminated portion of the grating structure and the process layer to generate a reflection profile; and a data processing unit configured to compare the generated reflection profile to a target reflection profile and identify dishing in the process layer based on the comparison of the generated reflection profile and the target reflection profile.

30. A processing line, comprising:

means for receiving a wafer having a grating structure including a trench and a process layer formed in the trench;

means for illuminating at least a portion of the process layer and the grating structure with a light source;

means for measuring light reflected from the illuminated portion of the process layer and the grating structure to generate a reflection profile; and means for identifying dishing in the process layer based on the reflection profile.

31. The processing line of claim 30, further comprising:

means for comparing the generated reflection profile to a library of reference reflection profiles, each reference reflection profile having an associated dishing metric;

means for selecting a reference reflection profile closest to the generated reflection profile; and means for identifying dishing in the process layer based on the dishing metric associated with the selected reference reflection profile.

32. The processing line of claim 30, further comprising:

means for comparing the generated reflection profile to a target reflection profile; and means for identifying dishing in the process layer based on the comparison of the generated reflection profile and the target reflection profile.

* * * * *